Figure 1:
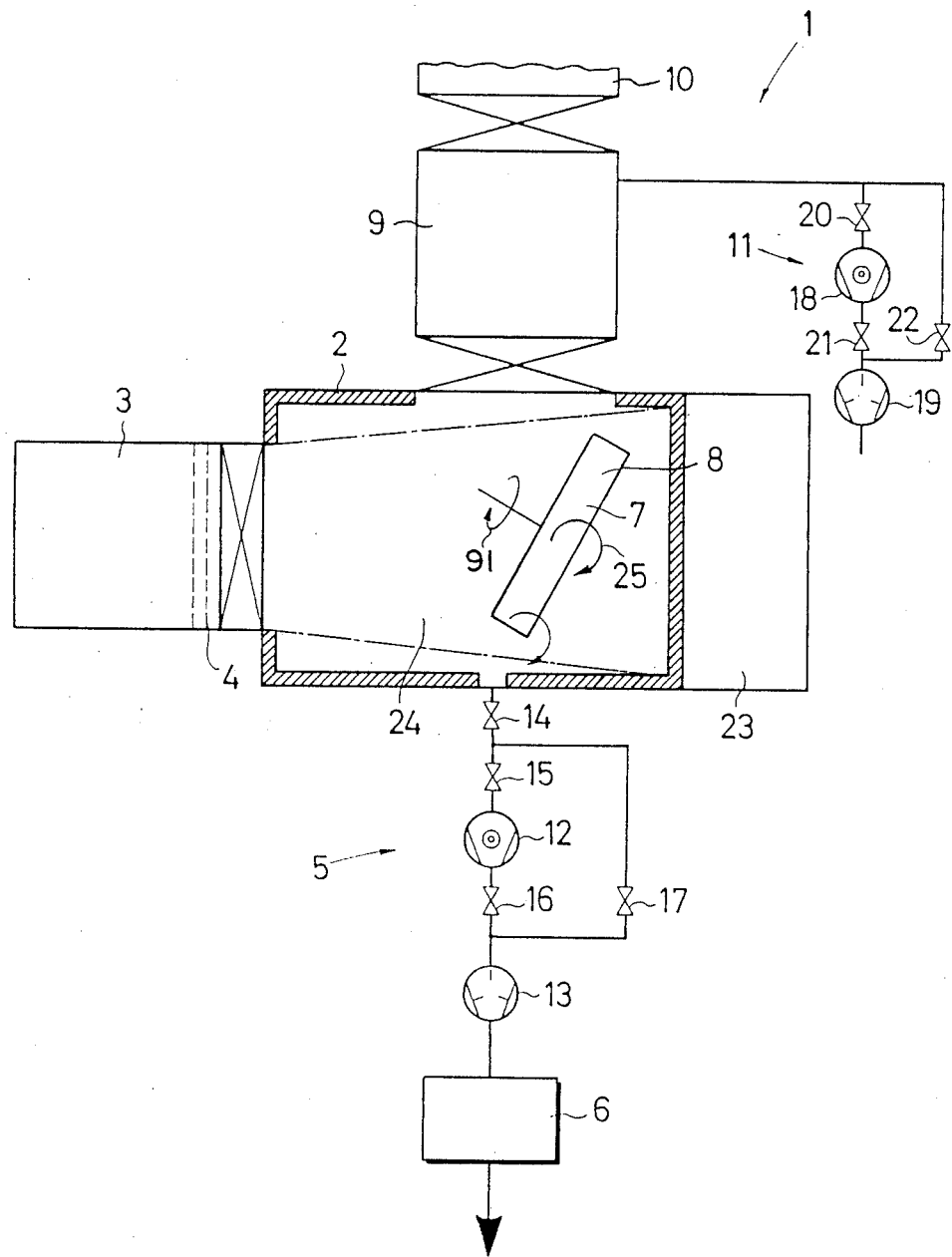

United States Patent [19]

Katzschner et al.

[11] Patent Number: 4,987,346
[45] Date of Patent: Jan. 22, 1991

[54] PARTICLE SOURCE FOR A REACTIVE ION BEAM ETCHING OR PLASMA DEPOSITION INSTALLATION

[75] Inventors: Werner Katzschner, Kleinkahl-Grosslaudenbach; Stefan Eichholz, Kiel; Michael Geisler, Wachtersbach; Michael Jung, Kahl, all of Fed. Rep. of Germany

[73] Assignee: Leybold AG, Fed. Rep. of Germany

[21] Appl. No.: 298,488

[22] Filed: Jan. 18, 1989

[30] Foreign Application Priority Data

Feb. 5, 1988 [DE] Fed. Rep. of Germany ....... 3803355

[51] Int. Cl.$^5$ .................... H01J 27/16; H05H 1/46
[52] U.S. Cl. .................... 315/111.41; 315/111.21; 315/111.31; 315/111.81; 313/230; 250/423 R
[58] Field of Search .................... 315/111.21, 111.41, 315/111.81, 111.31; 313/230; 250/423 R

[56] References Cited

U.S. PATENT DOCUMENTS

| | | | |
|---|---|---|---|
| 3,778,656 | 12/1973 | Fremiot et al. | 313/63 |
| 4,065,369 | 12/1977 | Ogawa et al. | 204/164 |
| 4,401,054 | 8/1983 | Matsuo et al. | 118/723 |
| 4,433,228 | 2/1984 | Nishimatsu et al. | 219/10.55 R |
| 4,481,229 | 11/1984 | Suzuki et al. | 427/38 |
| 4,492,620 | 1/1985 | Matsuo et al. | 204/192 R |
| 4,507,588 | 3/1985 | Asmussen et al. | 315/39 |
| 4,543,465 | 9/1985 | Sakuda et al. | 315/111.41 X |
| 4,585,541 | 4/1986 | Miyake et al. | 204/298 |
| 4,585,668 | 4/1986 | Asmussen et al. | 427/38 |
| 4,610,770 | 9/1986 | Saito et al. | 204/192.1 |
| 4,611,121 | 9/1986 | Miyamura et al. | 315/111.81 X |
| 4,630,566 | 12/1986 | Asmussen et al. | 118/50.1 |
| 4,691,662 | 9/1987 | Roppel et al. | 118/50.1 |
| 4,713,585 | 12/1987 | Ohno et al. | 315/111.81 |
| 4,739,169 | 4/1988 | Kurosawa et al. | 315/111.81 X |
| 4,739,170 | 4/1988 | Varga | 250/423 R X |
| 4,745,337 | 5/1988 | Pichot et al. | 315/111.41 |
| 4,767,931 | 8/1988 | Sato et al. | 315/111.81 X |
| 4,788,473 | 11/1988 | Mori et al. | 315/111.41 X |
| 4,857,809 | 8/1989 | Torii et al. | 315/111.41 X |
| 4,870,284 | 9/1989 | Hashimoto et al. | 315/111.81 X |

FOREIGN PATENT DOCUMENTS

| | | |
|---|---|---|
| 0028303 | 9/1980 | European Pat. Off. . |
| 0197668 | 10/1986 | European Pat. Off. . |
| 0209109 | 1/1987 | European Pat. Off. . |
| 0286132 | 10/1988 | European Pat. Off. . |
| 3144016 | 7/1982 | Fed. Rep. of Germany . |
| 0252916 | 12/1987 | Fed. Rep. of Germany . |
| 248904 | 8/1987 | German Democratic Rep. . |
| 60-243955 | 3/1985 | Japan . |
| 62-80950 | 4/1987 | Japan . |

OTHER PUBLICATIONS

Low Temperature Oxidation of Silicon in a Microwave-Discharged Oxygen Plasma, J. Electrochem.: Solid-State Science & Technology, Jun., 1985, pp. 1460–1466.
The Neutral Particles Injectors RIG for Fusion Reactors, Atomkernenergie-Kerntechnik, vol. 44, (1984), No. 1, pp. 81–86.
A Parametric Study of the Etching of Silicon in $SF_6$ Microwave Multipolar Plasmas, Japanese Journal of Applied Physics, vol. 26, No. 6, Jun. 1987, pp. 825–834.
Very High Current ECR Ion Source for an Oxygen Ion Implanter, Nuclear Instruments and Methods in Physics Research, B21(1989), pp. 178–181.

Primary Examiner—Eugene R. LaRoche
Assistant Examiner—D. Hyun Yoo
Attorney, Agent, or Firm—Eckerts, Seamans, Cherin & Mellott

[57] ABSTRACT

The invention relates to a particle source with which positive, negative, and neutral particles can be generated and applied on a substrate. The particle source comprises a container (26) in which a gas or gas mixture to be ionized is held. Into this container (26) an electromagnetic wave irradiates which preferably is a microwave. A torus-shaped magnetic field, which is generated with the aid of permanent magnets (32, 33) or electromagnets, simultaneously projects into the container (26). With the aid of a special control grid configuration (38, 39, 40) it becomes possible to draw off positive, negative or neutral particles from the container (26).

20 Claims, 9 Drawing Sheets

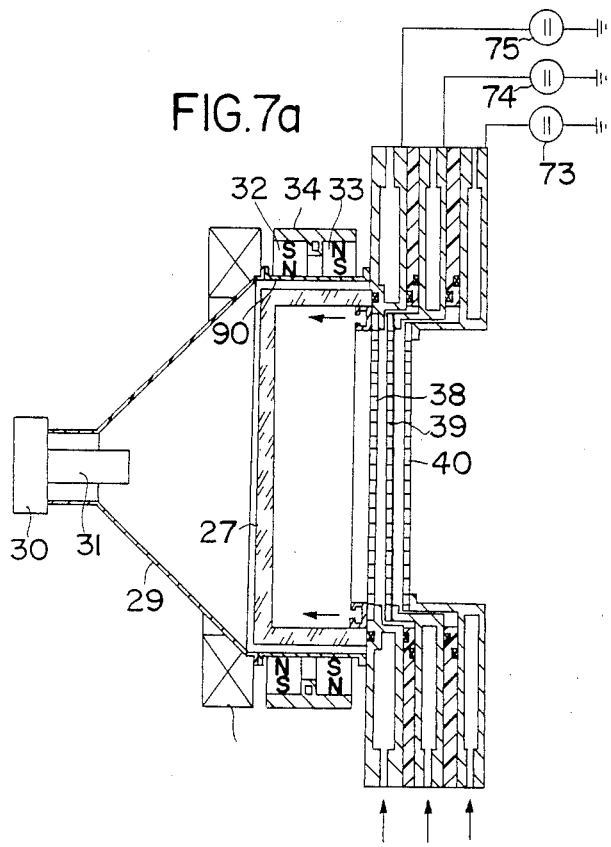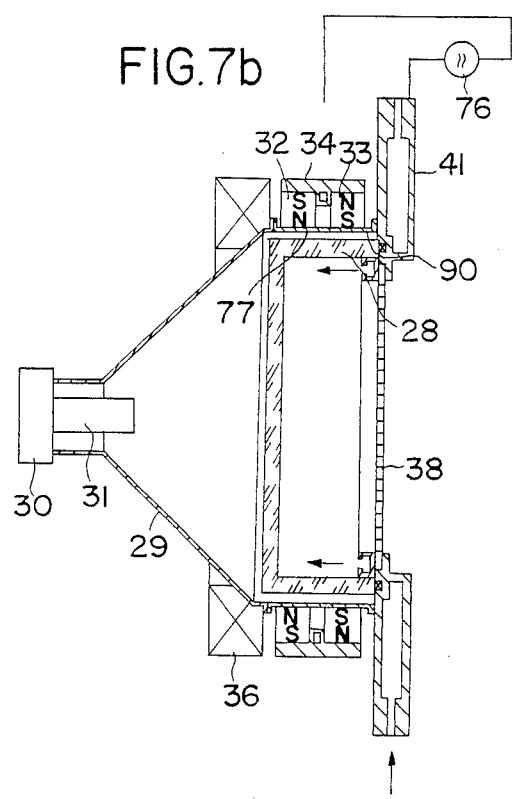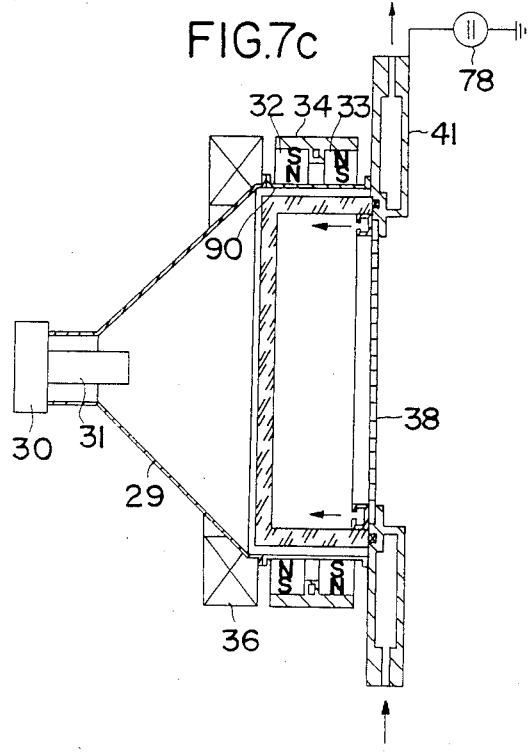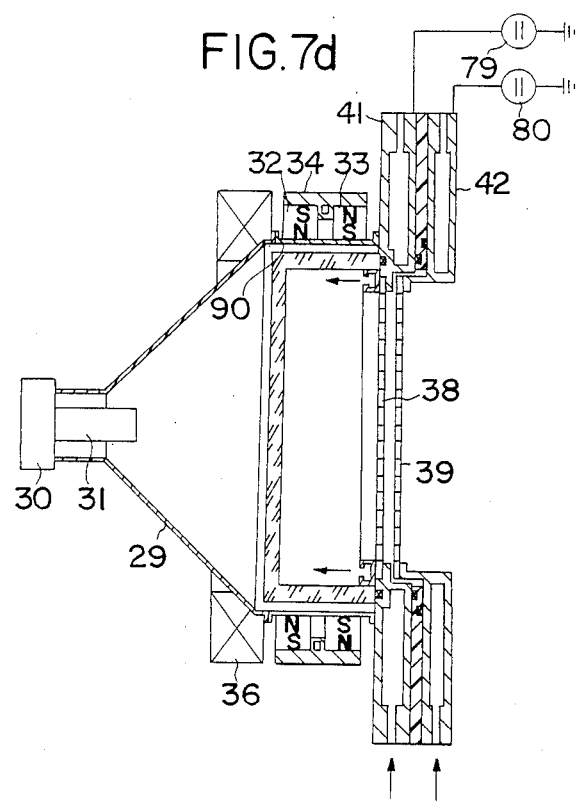

PARTICLE SOURCE FOR A REACTIVE ION BEAM ETCHING OR PLASMA DEPOSITION INSTALLATION

The invention relates to a particle source, in particular for a reactive ion beam etching or plasma deposition installation with a container of a non-ferromagnetic and non-conducting material for a gas or gas mixture or plasma which has an upper face and a side wall and which, opposite the upper face, has an aperture from which gaseous particles can exit from the container; a feed system for a gas or a gas mixture into the container; a device for feeding electromagnetic waves, preferably of microwaves which adjoins the upper face of the container; at least one magnetic field generator which is arranged outside the container and which contains at least one north pole and one south pole, with the north and south pole being directed onto the container in such a way that a curved magnetic field forms between north and south pole which projects into the interior of the container.

A method for etching or chemical treatment of surfaces by means of a microwave or UHF plasma is already known in which a thin and disk-shaped plasma is generated (U.S. Pat. Nos. 4,507,588, 4,585,668, 4,630,566, 4,691,662). The diameter of a plasma disk is herein relatively large and is approximately 50 cm. The device with which the known method is carried out can have a static magnetic field which surrounds the plasma source and which functions for generating an electron cyclotron resonance. This device has the disadvantage that it has a movable metal plate which is moved toward or away from the plasma disk in order to produce particular resonance conditions. Further, a microwave plasma source is known which functions as discharge space and in which the microwave energy is fed into this discharge space (U.S. Pat. No. 4,433,228). In the propagation path of the microwave which leads to the discharge space a permanent magnet is located which generates a magnetic field in the discharge space. This magnetic field functions for the guidance of the plasma generated by the microwave, i.e. essentially for guiding the plasma electrons along the B field lines. Hereby the plasma is to be brought as closely as possible to the substrate which means that the magnetic field lines at least partially penetrate the substrate. An electron cyclotron resonance is not generated by the magnetic field of the permanent magnet.

Furthermore, a device is known with which a plasma is generated by means of a high frequency wave which is introduced into a wave guidance in which a glass tube is located in which a plasma is generated (DE-OS No. 31 44 016; Kimura, Murakami, Miyake, Warabisako, Sunami, and Tokuyama: "Low Temperature Oxidation of Silicon in a Microwave-Discharged Oxygen Plasma", J. Electrochem. Soc., Solid-State Science and Technology, Vol. 132, No. 6, 1985, pages 1460–1466, FIG. 1). Surrounding the plasma generation tube a coil is provided which induces a magnetic field along the axis of the glass tube. With an angular frequency $\omega$ of the high frequency field and with a magnetic flux density B the cyclotron resonance frequency $\omega = e^*B/m^*c$ is obtained at which the energy of the high frequency wave is continuously supplied to the electrons. Of disadvantage in this device is, however, that no homogeneous plasma distribution is achievable. The analogous applies for other known methods also (DE-P Nos. 26 32 194, 31 17 252, DE-OS No. 33 22 680, U.S. Pat. Nos. 4,492,620, 4,610,770, 4,585,541).

Further, a device is known with which a film can be applied on a substrate by means of a plasma of low temperature (EP-A2 0 209 109). This device has a first chamber in which the low-temperature plasma is generated as well as a second chamber in which is disposed the substrate to be coated. With the aid of a grid electrode the plasma is drawn from the first chamber into the second chamber so that a film of activated gas becomes deposited on the surface of the substrate. Around the first chamber is placed an electromagnet which generates an electron cyclotron resonance in the plasma.

This known device has the disadvantage that a cavity resonator is used for coupling in the electromagnetic field, and that for inducing the magnetic field necessary for the electron cyclotron resonance conditions, electromagnets are used which surround the plasma chamber and the cavity resonator. Due to this fact the shape and size of the plasma chamber cannot be chosen arbitrarily but rather are subject to limitations. Increasing the resonator or the plasma chamber beyond a diameter of $d \geq 30$ cm requires large magnetic coils for inducing the requisite magnetic field. Such coils can only be realized with very large expenditures. The distribution of the magnetic field which obtains due to the coil arrangement is not optimal for generating a homogeneous plasma. Furthermore, size and shape of the resonator strongly affect the efficiency of the plasma generation, since as a function of the resonator geometry the number of modes of the electromagnetic microwave field capsule of propagating also increases which do not contribute to plasma excitation. With the known device it is, in particular, not possible to realize spatially extended plasmas of high efficiency as source for ion beams with any given cross section area, high ionic current density, and high beam homogeneity with low extraction energies.

Furthermore, an ion source is also known in which, through the cooperation of microwaves and magnetic fields, electron cyclotron resonance conditions can be created (U.S. Pat. No. 3,778,656 = DE-OS No. 22 37 252). This ion source has an ion collection arrangement with an expansion shell, which has an aperture open to the microwave excitation space. The plasma density is greater in the vicinity of the aperture of the expansion shell and is equal to zero at a collector electrode. This known ion source also does not permit achieving homogeneous plasma distributions.

A known microwave broad beam ion source for generating a large area ion beam is provided with a cavity resonator, a magnetic coil, and an extraction system (DD-248 904-A1). The cylindrical cavity resonator here has a discharge space of height h having a ratio to the diameter d of $h/d = 0.7$. This discharge space is surrounded by an annular magnetic coil the height of which corresponds to the height of the cavity resonator. In order to be able to fulfil the ECR condition with the aid of the magnetic field of this magnetic coil, very high currents must flow through the coil. In addition, for coupling in the electromagnetic waves a coupling port is provided the diameter of which is only approximately one half as large as the diameter of the cavity resonator in which the plasma is located. The microwaves are guided to this coupling port via an $E_{01}$ circular waveguide the diameter of which corresponds to the diameter of the coupling port.

Lastly, an ion source is also known which has a vacuum container which extends in the same direction as an arriving microwave (JP-62-80950-A1). Around the vacuum container permanent magnets are here provided with the north pole of the one permanent magnet generating with the south pole of the adjacent permanent magnet an arc-shaped magnetic field which projects into the vacuum container. With the high field strength which modern permanent magnets can generate it is readily possible to fulfil the ECR condition. With this ion source coupling in the electromagnetic waves also takes place by means of a circular waveguide the diameter of which corresponds to only one half of the diameter of the vacuum vessel. Due to the abrupt transition from circular waveguide to vacuum vessel the radiation field is strongly affected which leads to a reflection of the feeding waves and to the excitation of other waves types in the aperture.

The invention is therefore based on the task of generating a beam with high particle current density of charged and/or neutral particles which has a large area and may have any given cross section.

This task is solved in that the device for feeding electromagnetic waves is a flared radiator whose widest flare opening corresponds essentially to the area of the upper face of the container, that the side wall of the container is surrounded by an electrically-conducting but not ferromagnetic hollow body, and that the magnetic field generator is arranged on the outside of the hollow body and extends at the level essentially of the opening of the container to the widest flare opening of the flared radiator.

The advantage gained with the invention consists in particular in that a very uniform and large-area radiation of particles becomes possible with the charged particles being essentially drawn off by control grids. The hollow waveguide radiator used, which widens flare-shaped at the open end, is called flared radiator or also horn radiator. The widening has a rectangular, square or round cross section corresponding to the cross section of the hollow waveguide. Depending on whether or not the widening occurs in the direction of the electric field vector E or of the magnetic field vector H, the horn radiator is referred to as E-sector horn or H-sector horn. In the flare-shaped widening of the horn radiator a type of wave similar to the fed-in type of wave is guided further to the aperture opening, while higher types of waves excited at the neck of the horn because of discontinuity are strongly (reactively) attenuated in the case of a moderately large angle of aperture of the horn and hardly contribute to the radiation. Apart from E-sector horn and H-sector horn, the pyramidal horn and the conical horn are also known. The pyramidal horn can be viewed as a combination of E- and H-sector horn with respect to its radiation. Pyramidal and conical horns with $\delta/\lambda > 0.5$ ($\delta$ = angle of aperture) have special radiation properties; they are quasi-optical horns. The main lobe in particular changes only slightly with the frequency. Horn radiators thus function inter alia to convert spherical waves into planar waves as is known from the field of optics in view of the parabolic reflector.

With the invention a particle source is created with which it is possible to generate a plasma beam, an ion beam, an electron beam or a neutral particle beam which can be used for structuring solid state surfaces, for modifying properties of structure of surfaces such as amorphization, densification or implantation as well as for deposition. Deposition is possible from out of the beam, through precipitation from a gaseous phase or through sputtering from a solid body. The beam produced according to the invention has a very large area and any given shape. However, it is preferably round, rectangular or oval. A round beam, for example, has an effective diameter of more than 200 millimeters. The particle current density relative to singly positively charged ions is greater than 10 mA/m$^2$. The particle energy is variable within the range $>10$ eV–$<10$ KeV. With the beam a homogeneity of the particle current density of $>95\%$ is achieved, i.e. the particle density variation over the beam cross section is less than 5%. The particle source according to the invention operates at a high degree of ionization in the pressure range of $P \geq 10^{-4}$ mbar to $P \leq 10$ mbar. Operation with inert and reactive substances is possible, for example reactive gases, inert gases, and gas mixtures. The high absolute degree of ionization of the plasma is achieved in particular through the combination of torus-shaped magnetic fields with the microwave coupling in via horn radiators. In addition, through the use of one or two sets of annular sets of magnets and optionally through the use of an additional superimposed magnetic field, a homogeneous plasma distribution results. Use of special extraction optics as well as a plasma container of quartz minimizes the plasma impurities. Since the permanent magnets are arranged outside the plasma no contaminations occur within the plasma.

An embodiment example for the invention is distinguished by the use of permanent magnets and by the particular shape of the magnetic field set up through the magnet configuration. For the case of rotationally symmetrical sources torus-shaped or double torus-shaped magnetic fields result which lead to particularly low-loss plasmas which are distinguished by high ionization density, high reactivity, and, consequently, high productivity. Such configuration provides the precondition for a high particle current density in the extracted particle beam. The rotationally symmetrical structure and the external torus-shaped magnetic field effect a very good radial uniformity of the plasma distribution and therewith an extremely high beam homogeneity. Use of a second central magnetic field in the rotationally symmetrical configuration brings with it a further improvement of the radial uniformity.

Inhomogeneous non-toroidal magnetic fields, generally, generate in the plasma charge carrier drift motions which are opposite for positive ions and electrons. Through the herewith effected charge separation plasma instabilities are generated which increase the plasma losses and decrease the mean electron density. Toroidal magnetic fields such as that used in the invention have the advantage that the charge carrier drift motions do not lead to a charge separation and the above mentioned plasma instabilities, therefore, cannot occur. The electron density in such torus magnetic fieldguided plasmas is especially high. Consequently, the chemical reactivity is increased, which represents a purpose of the invention.

With the type of plasma excitation according to the invention, particle beams with very low energy focus-blurring can be generated. By placing the magnet poles obliquely the extraction behaviour and the beam properties can additionally be influenced positively. The magnet poles are preferably arranged at an angle of 90° relative to the direction of extraction. A further advantage consists in that the source according to the invention is not limited to a cylindrically-symmetric arrangement, but rather that any source shapes and hence also any beam shapes can be realized without impairment of the source efficiency. Superimposition of an additional magnetic field permits influencing the operational behaviour of the source, perhaps through minimizing the wall losses in the plasma space or through displacement of the zone of the electron cyclotron resonance in the plasma space, which effects the beam homogeneity.

The particle source according to the invention is suitable, in particular, for use in microstructure technology because it does justice to the continuously rising demands, in contrast to the known plasma and ion etching.

Figure 2:
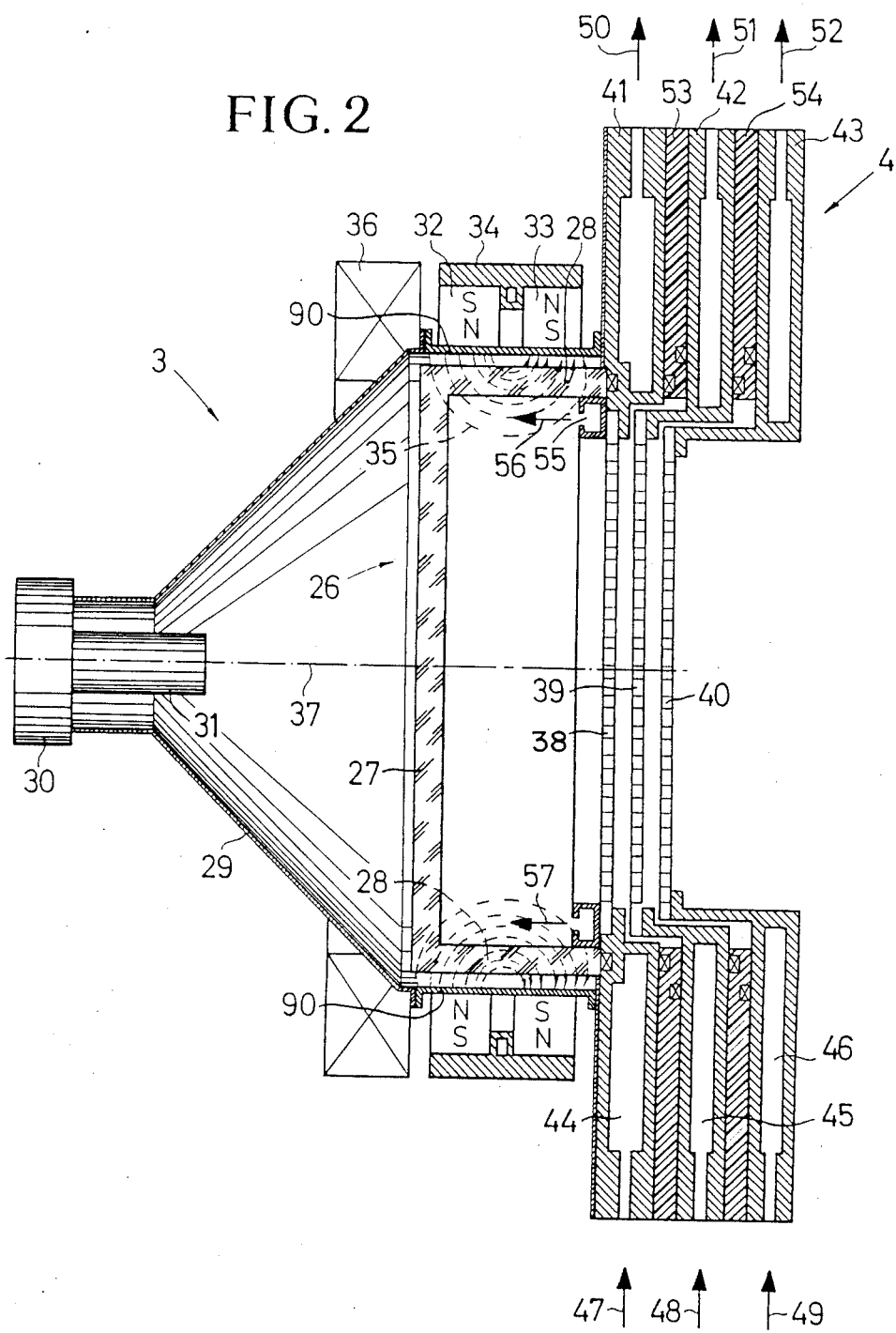
Figure 3:
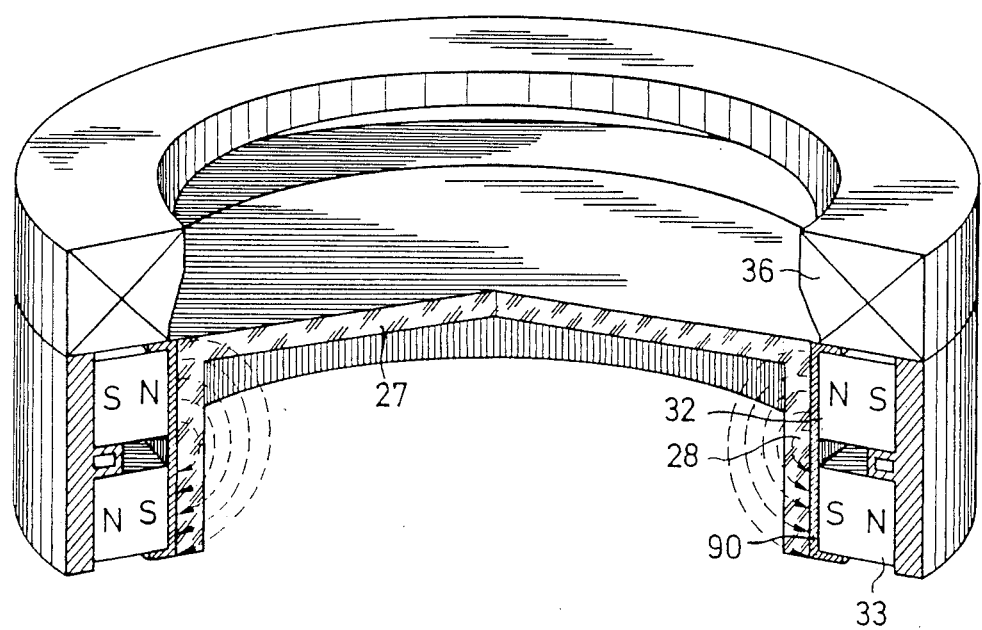
Figure 4:
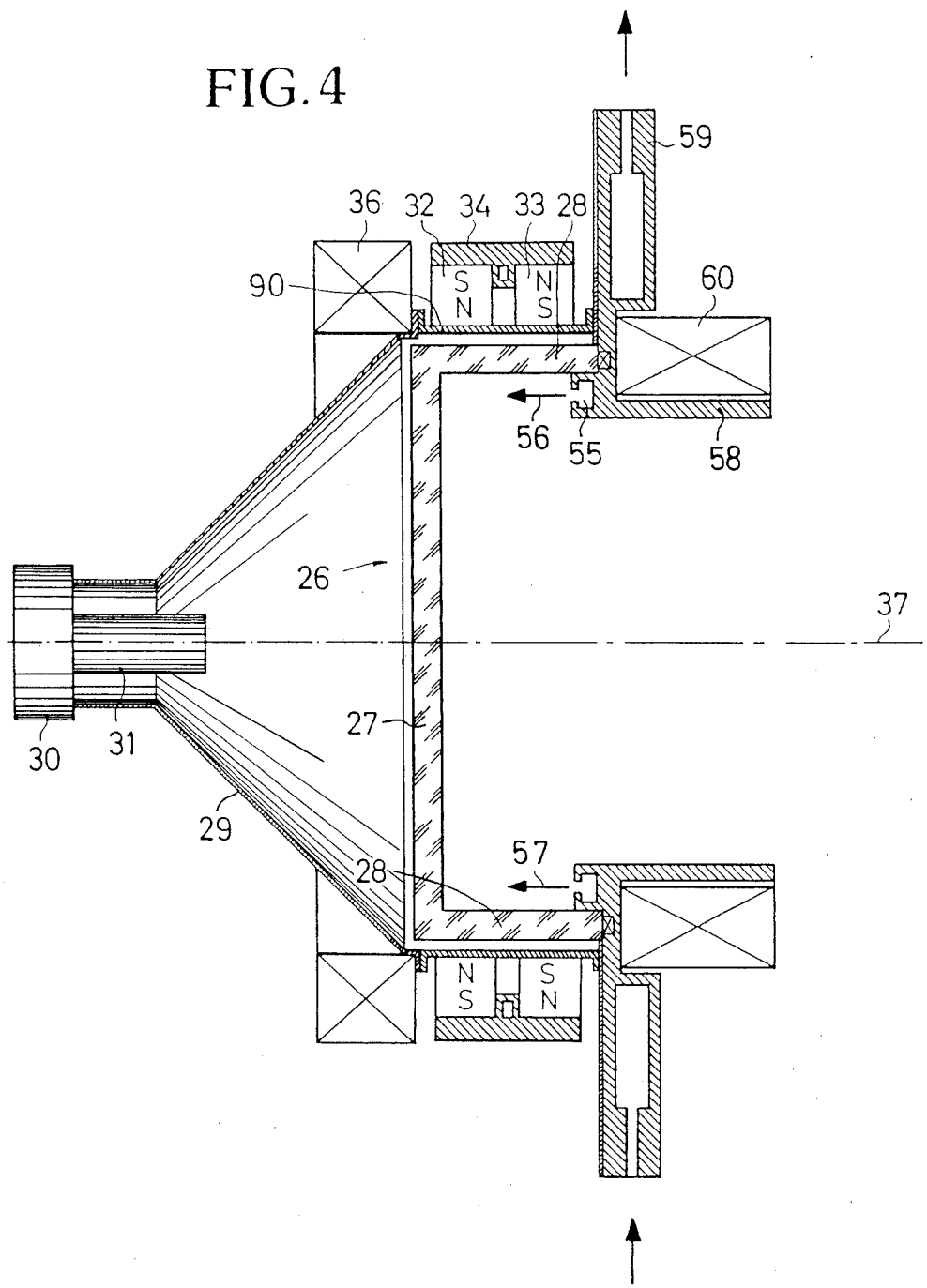
Figure 5:
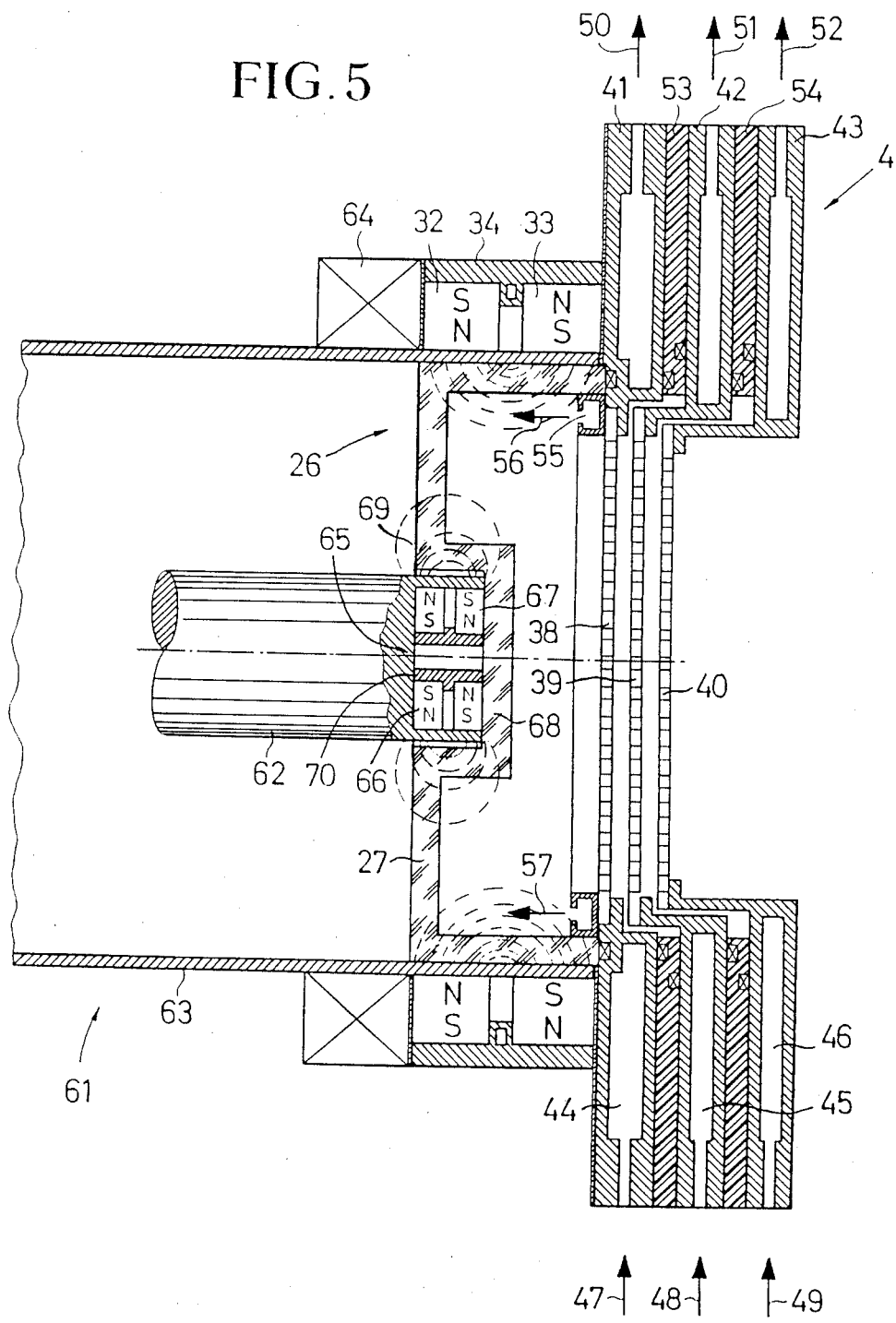
Figure 6:
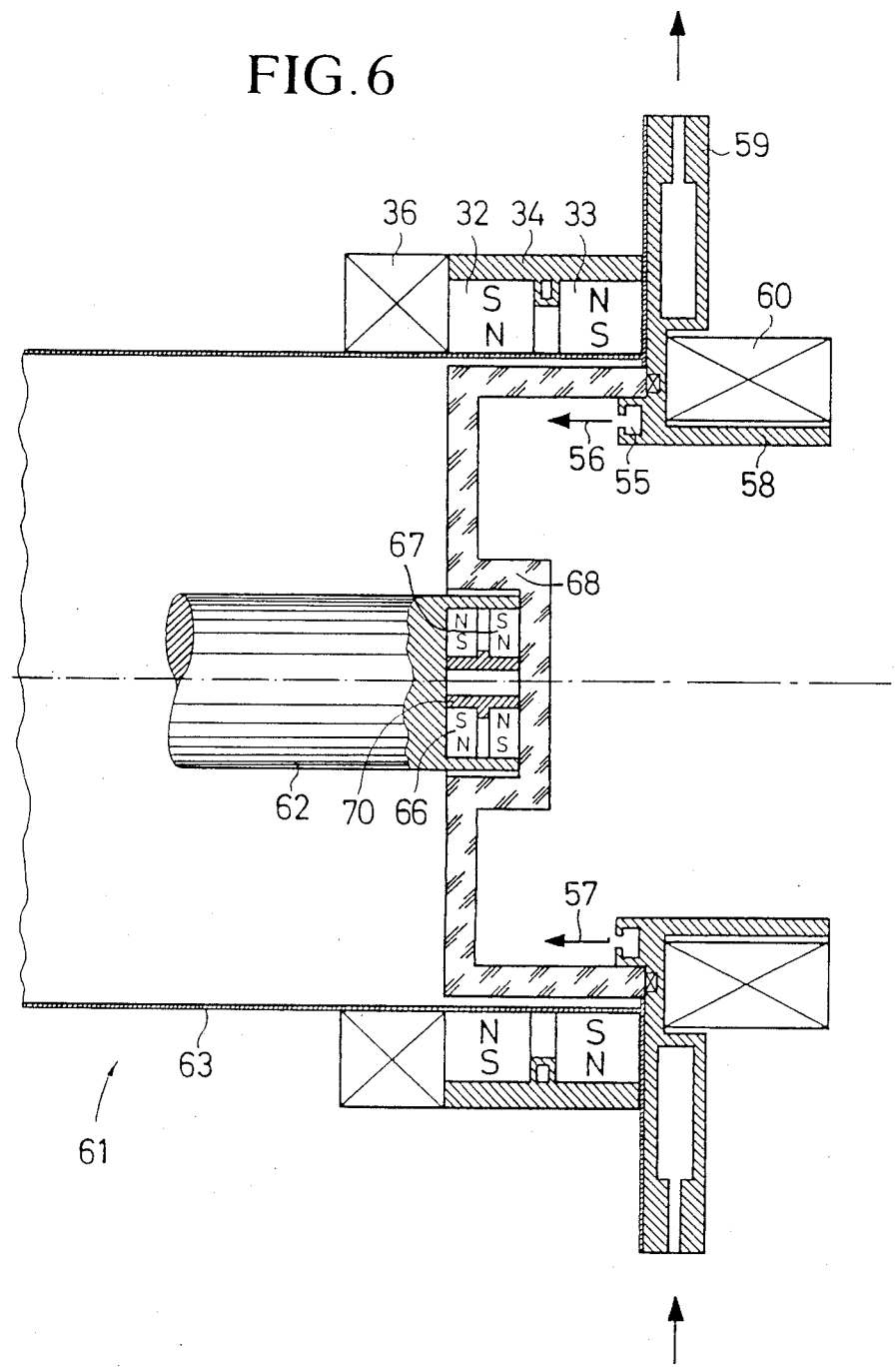
Figure 8:
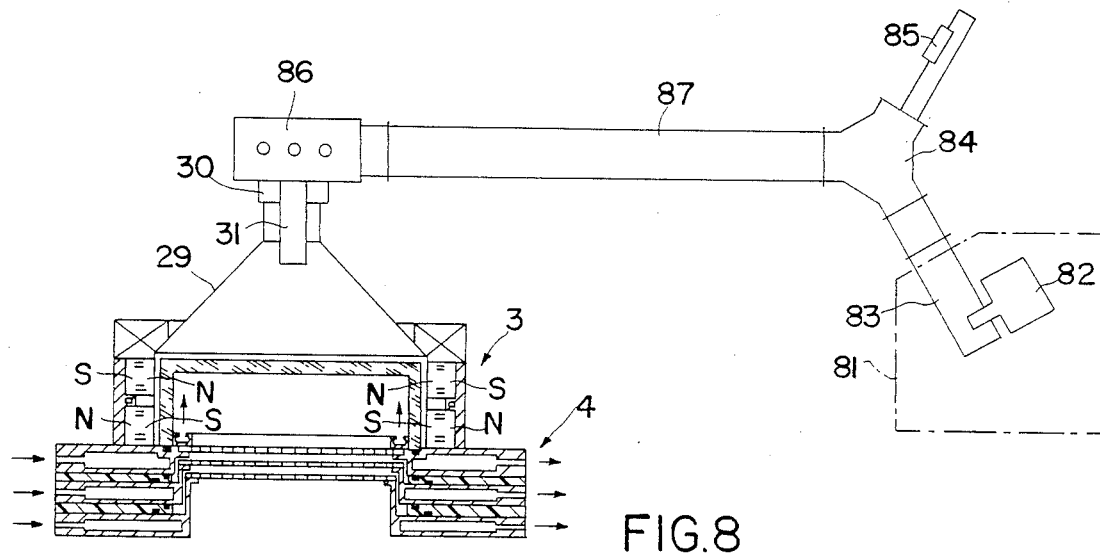
Figure 9:
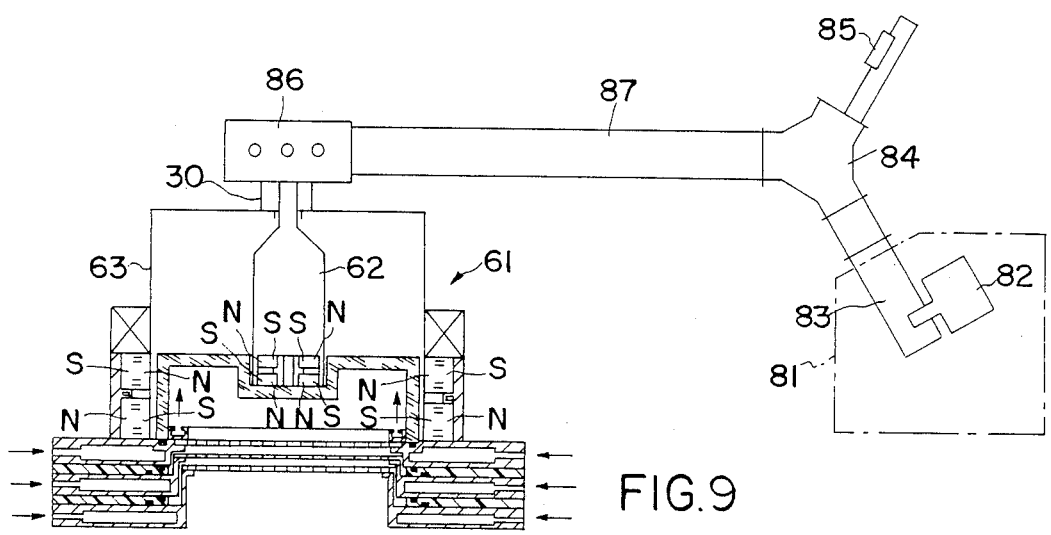
Figure 10:
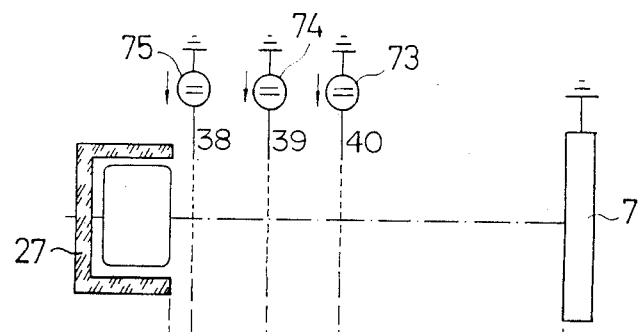
Figure 10:
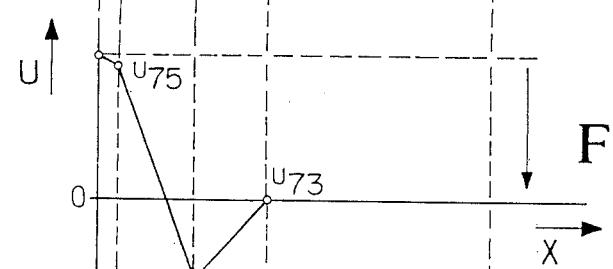
Figure 10:
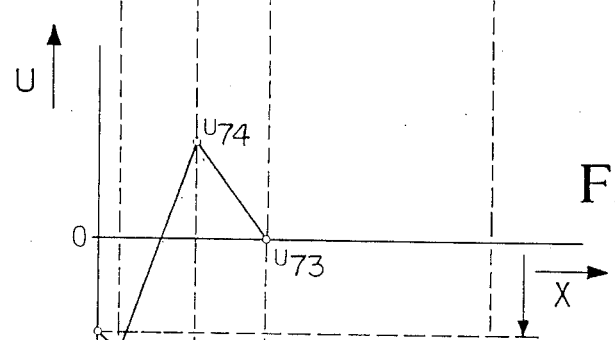
Figure 10:
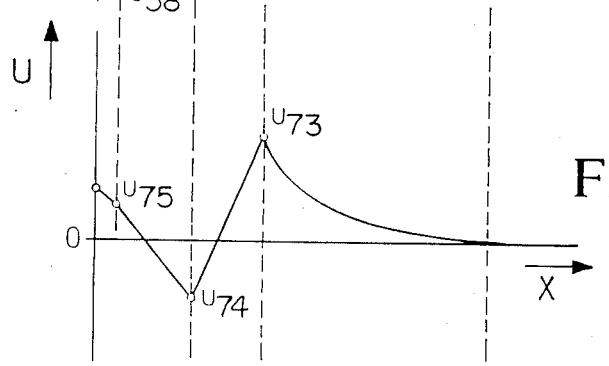

Embodiment examples of the invention are represented in the drawing and are described below in fuller detail. Therein FIG. 1 represents a schematic representation of a reactive ion beam etching or plasma deposition installation;

FIG. 2 a first embodiment of an electron cyclotron resonance microwave ion source;

FIG. 3 a perspective representation of annularly configured permanent magnets used in the ion source according to FIG. 1;

FIG. 4 a second embodiment of an electron cyclotron resonance microwave ion source;

FIG. 5 a third embodiment of an electron cyclotron resonance microwave ion source;

FIG. 6 a fourth embodiment of an electron cyclotron resonance microwave ion source;

FIG. 7a to 7d different electrical circuit configurations of the microwave ion sources depicted in FIGS. 2, 4, 5, 6;

FIG. 8 a first device for feeding the microwave energy into an ion source;

FIG. 9 a second device for feeding the microwave energy into an ion source;

FIG. 10 a fundamental representation of three extraction grids, one plasma space, and a sample table;

FIG. 10a the potential profile across three extraction grids during extraction of positive ions;

FIG. 10b the potential profile across three extraction grids in the extraction of electrons and negative ions;

FIG. 10c the potential profile across three extraction grids in the extraction of neutral particles;

In FIG. 1 is illustrated in principle an ion beam etching or plasma deposition layout 1 which comprises a reaction chamber 2, an ion source 3 with an extraction arrangement 4, a pump system 5 for aggressive materials, an outgas detoxification device 6, a sample positioning arrangement 7 with fixing mechanism 8, a vacuum interlock 9 with a sample transfer arrangement, a connection 10 for a coffer station as well as a pump system 11 for the vacuum interlock 9.

The pump system 5 for the aggressive materials contains two pumps 12, 13 as well as four valves 14 to 17, while the pump system 11 for the vacuum interlock is provided with two pumps 18, 19 and three valves 20, 21, 22. Such pump systems are known and will therefore not be described in greater detail.

In termination to the reaction chamber 2, a device 23 for carrying out analyses as well as for the process control is provided. The particle beam 24 which, extending from the ion source 3 reaches the reaction chamber 2, is indicated by numerous dots. Arrows 25, 91 indicate that the sample positioning device 7 for adjusting any given means of bombardment of the sample is rotatable about an axis and has a sample platform rotatable about the center axis.

The subject matter proper of the invention relates to the particle source 3, represented only schematically in FIG. 1, with the extraction device 4. In FIG. 2 further details of this particle source are depicted.

This particle source has a container 26 of quartz with a circular flat or circular arched face 27 and a cylindrical side wall 28. Adjoining the face 27 of container 26 is a cone-shaped horn radiator 29 which is flanged onto a hollow body 90 of conducting, non-ferromagnetic material surrounding container 26. Into the horn radiator 29 an electromagnetic wave is fed via a coupling element 30 and a coupling pin 31.

Circumjacent to the cylindrical side wall 28 two permanent magnets 32, 33 are aligned, with the north pole of the one permanent magnet 32 directed toward the container 26 while the north pole of the other permanent magnet 33 points away from this container 26. These permanent magnets 32, 33, which have extremely strong fields and are, for example, of type Vacumax 140 or Vacudyn, are surrounded by an externally mounted iron yoke 34 in order to generate a torus-shaped magnetic field 35 in the interior of the container, functioning as reactor vessel which supplies a magnetic induction which at a predetermined excitation frequency of the microwave field fulfils the electron cyclotron resonance conditions. It is also possible to use a horseshoe magnet or an electromagnet instead of two permanent magnets.

A plasma of high ionization density is generated within the container 26 utilizing this electron cyclotron resonance (ECR). The induction of 875 gauss necessary to fulfil the ECR conditions at a predetermined excitation frequency of, for example 2.45 GHz, results through the toroidal magnetic field 35. Whenever "microwaves" and "ECR conditions" are discussed below, all frequency ranges of electromagnetic radiation are included with which ECR conditions are fulfillable and as long as excitable modes of the electromagnetic field are capable of propagation. It is also not always necessary that the resonance condition be fulfilled, but rather it is sufficient if a not insignificant amplification occurs.

Apart from the two permanent magnets 32, 33, an additional electromagnet 36 is provided which is placed around the horn radiator 29, and specifically, directly adjoining magnet 32. With the aid of this electromagnet a magnetic field is induced whose field lines extend essentially parallel to the center axis 37 of the horn radiator 29 and which affects the plasma distribution.

At the exit of container 26 the extraction device 4 is located. This has three extraction grids 38, 39, 40 which are at different potentials. Each of these extraction grids 38, 39, 40 is connected at its periphery area with its own support 41, 42, 43 which has a hollow space 44, 45, 46. This hollow space 44, 45, 46 functions for receiving a cooling agent, for example water. This water is introduced through openings into the supports 41 to 43— which is indicated by arrows 47, 48, 49—and brought from the support 41 to 43 through outflow openings, which is indicated by arrows 50, 51, 52. Between two adjacent supports 41, 42 or 42, 43 an electrical insulation layer 53, 54 is provided respectively.

The support 41, which is connected to that grid 38 which is directly opposite the container 26, has a gas inlet 55 which is integral with this support 41. Feeding the gas into this gas inlet takes place through at least one bore in support 41. The inflow of the gas is indicated by arrows 56, 57.

The generation and transport of ions by means of the arrangement depicted in FIG. 2 takes place in the following manner.

The gas which streams into container 26 through gas inlet 55 is ionized by the electromagnetic wave which is radiated by the horn radiator 29. Due to the magnetic field distribution which is brought about by the permanent magnets 32, 33 a "racetrack" for electrons and ions is formed within the quartz container 26, such as is also known from magnetron sputter cathodes. Thereby it becomes possible to significantly increase the degree of ionization which, based on the microwave irradiation alone, is not yet very high. The advantage of the toroidal magnetic field compared to other magnetic fields consists in the electron cyclotron resonance method in that in the periphery of container 26, i.e. within the effective area of the electromagnetic ac field, a magnetic field is created which fulfils the ECR conditions. Thereby a zone of very high ionization efficiency is established which encloses the plasma region relevant for the particle extraction and supplies into this plasma region the plasma components to be extracted. The superimposed magnetic field of electromagnet 36, depending on the direction of the induced magnetic field, brings about a radial contraction or a radial expansion of the ECR excitation region and functions to control the plasma density distribution in container 26.

The plasma indicated by dots in FIG. 2 located in container 26 can only with the aid of special control methods serve as ion source, electron source or as source for neutral particles. If grid 38 is at a positive potential, grid 39 at a negative potential, and grid 40 at zero potential (ground), the negatively-charged particles (electrons, negative ions) remain trapped in the container while the positively charged particles (positive ions) are drawn off. Through this circuit configuration the positive particles are first extracted with a high voltage (sum of the voltages at grids 38 and 39)—thereby a high particle current density is achieved—and subsequently retarded by the potential difference between grid 39 and grid 40 (acceleration, deceleration). With the aid of this circuit configuration high ion current densities with low ion energy can be realized.

If a negative potential is applied to grid 38, a positive potential to grid 39, and zero potential (ground) to grid 40, the positive particles remain trapped in the container while the negatively charged particles (electrons, negative ions) are drawn off. The negative particles are in turn extracted with a high voltage (sum of the voltage between grids 38 and 39) which leads to a high particle current density, and retarded by the potential difference between grid 39 and grid 40.

Neutral particles can be generated, for example, whereby the grid 38 is at a positive potential, grid 39 at a negative potential, and grid 40 again at a positive potential and the potentials must be selected so high that the grids are effectively a barrier for electrically charged particles and only permit neutral particles to pass which subsequently are, however, not electrically accelerated but have only the velocity of the temperature-dependent molecular motion.

The cooling of supports 41, 42, 43 by means of water or another medium effects also a cooling of grids 38 to 40 themselves. This has the advantage that these do not heat up excessively due to impinging plasma particles and are thereby destroyed.

The voltages which result due to the different grid potentials are shown in FIGS. 10a to 10c and are there again described with respect to their effect.

In FIG. 3 a perspective view of container 26 with the permanent magnets 32, 33 surrounding it is depicted. The toroidal magnetic field for the generation of the electron cyclotron resonance can herein clearly be recognized.

FIG. 4 shows a further embodiment of the invention in which the plasma is generated in the same manner as in the arrangement according to FIG. 2, but for the extraction of the charged particles different means are provided. Instead of electrical dc and/or ac fields which extend from the control grids 38 to 40, magnetic fields are utilized for the extraction. Around an annular body 58 containing the gas feed 55 and provided with a cooling device 59, an electromagnet 60 is disposed which induces a magnetic field whose central field lines extend along axis 37.

In FIG. 5 a further embodiment of the invention is depicted in which the coupling in of the microwave radiation does not take place through a horn radiator but rather through a suitably dimensioned coaxial waveguide 61 which has an inner conductor 62 and an outer conductor 63. A further particularity lies in the use of an annular electromagnet 64 which is arranged similar to the electromagnet 36 of FIG. 2, as well as in the use of an annular magnet 65 arranged in the end piece of the inner conductor 62 of the coaxial waveguide. The part of the end piece of the inner conductor 62 of the coaxial waveguide 61 containing the annular magnet 65 projects into a recess 68 of the face 27 of container 26. The poles of the annular magnet 65 are completely within the recess 68 and point toward the interior of container 26 and generate within the interior of the container a second torus-shaped magnetic field. Between the two magnet rings forming the pole surfaces a magnetic connection exists via an iron yoke 70 which has the shape of a cylindrical sleeve.

The direction of the magnetic field lines 69 may coincide with the direction of the magnetic field lines 35 or it may be directed oppositely. The direction of the magnetic field lines 69 can be selected through the corresponding mounting of the ring magnets 66, 67 in the recess 68.

Use the two torus-shaped magnetic fields, given suitable selection of the field strengths, creates two electron racetracks and, hence, two annular ECR zones. Hereby the density distribution in the plasma space and therewith the homogeneity of the particle beam to be extracted can be affected. Augmentation of this homogenization effect is additionally possible thereby that the electromagnet 64 is provided which surrounds the end of the outer conductor 63.

As is evident in FIG. 5, the outer conductor 63 and the inner conductor 62 of the coaxial cable 61 are adapted to the geometry of container 26. The diameter of the outer conductor 63 corresponds essentially to the diameter of the container, while the diameter of the inner conductor 62 corresponds essentially to the diameter of the recess 68.

The embodiment example represented in FIG. 6 is a hybrid of the embodiments depicted in FIGS. 4 and 5. The permanent magnets 32, 33, the electromagnets 36, 60, the gas feed 55 and the cooling device 59 are arranged corresponding to the configuration after FIG. 4, while the feed of the microwave energy and the second ECR region are arranged corresponding to the configuration of FIG. 5. In contrast to the configuration of FIG. 5, in the configuration according to FIG. 6 a magnetic field is used for particle extraction, with this magnetic field being induced through the electromagnets 36 and 60.

In FIG. 7a the ion source according to FIG. 2 is once again depicted, wherein however, the electrical connections of the grids are now represented. It can here be seen that the grids in each instance are at any arbitrary potentials. These potentials are symbolized through the voltage sources 73, 74, 75.

FIG. 7b shows an ion source which has only one extraction grid 38 and in which the ions are extracted by means of an ac voltage. The extraction grid 38 consists of conductive material which can be provided with an insulating coating. On support 41 of grid 38 lies the one pole of an ac voltage source 76 whose other pole is connected to a metal strip 77 which annularly encloses the side wall 28.

A dc voltage extraction with only one dc current potential is represented in FIG. 7c. A dc voltage source 78 is herein connected at one terminal and at support 41 and, hence, with grid 38, while the other terminal of the dc voltage source is at ground.

FIG. 7d shows a dc current two-grid configuration, in which the two grids 38, 39 are in each instance at a given potential. These potentials are made available by the dc voltage sources 79, 80.

All dc voltage sources 73, 78, 79, 80 are adjustable from zero up to a given maximum value as well as also switchable with respect to polarity.

In FIG. 8 is depicted the manner in which the microwave power is fed to the plasma chamber. To this end a microwave generator 81 is provided which consists of the actual generator 82 and a connecting member 83. This connecting member is connected to a circulator 84 to which an impedance matching pad is connected which functions as so-called microwave waveguide sink. The circulator 84 is, in turn, connected to an impedance transformer 86 via a rectangular hollow waveguide 87. This impedance transformer 86 is connected via a coupling element 30 to the horn radiator 29.

For potential isolation an insulator can be inserted in the coupling element 30.

In the configuration of FIG. 9 the same elements 81 to 87 can be used for the generation of the microwaves as in the configuration according to FIG. 8. The feeding of the microwaves in this case, however, takes place via the coaxial waveguide 61.

In FIG. 10 the plasma chamber with the face 27, three voltage sources 73, 74, 75, grids 38, 39, 40 as well as the sample table 7 are shown in principle.

FIG. 10a shows the potential gradient from the plasma chamber to the sample table 7 for the drawing off of positive ions. The effective acceleration voltage which is present immediately at the exit of the plasma chamber 27 is herein characterized by the intersection of the dashed lines with the U-axis. The potential present at grid 38 is positive and somewhat less than the effective acceleration voltage. Hereby a negative potential gradient originates which attracts the positive ions and repels the negative electrons. At grid 39 a negative potential of such magnitude is present that at the location of the grid overall a negative potential obtains. This negative potential is brought to zero through the potential at grid 40 at the location of this grid 40. Through the negative potential gradient between grids 38 and 39 the positive ions are initially strongly accelerated and subsequently due to the positive voltage drop between grids 39, 40 again somewhat retarded.

The effective acceleration voltage for the drawing off of electrons and negative ions is represented in FIG. 10b as intersection of the dashed line with the U-axis. This effective voltage is somewhat less negative than the voltage at grid 38 so that a positive potential gradient results which attracts the electrons and negative ions. Between grids 38 and 39 exists a very strong positive potential gradient through which the electrons and negative ions are accelerated. The negative particles are subsequently again somewhat retarded through a negative potential gradient between grids 39 and 40.

A potential profile over the distance between the plasma chamber and sample table 7 with which neutral particles can be drawn off is shown in FIG. 10c. The negative voltage drop between grid 38 and the exit of the chamber initially draws positive particles from the chamber and blocks negative particles. Neutral particles, due to their kinetic energy, initially pass all potential barriers which are set up through grids 38, 39, 40. The positive particles between grids 38, 39 are further accelerated through the negative potential gradient, negative particles which had overcome the potential barrier at grid 38 are simultaneously accelerated through the positive voltage drop in the direction of the chamber and, hence, kept away from the sample table 7. Between grids 39 and 40 a very strong positive voltage drop obtains which retards the positive particles and keeps them away from sample table 7. Consequently only neutral particles reach the sample table.

The additional electromagnets 66, 67 provided in connection with a coaxial cable can analogously also be provided in a configuration according to FIGS. 1 to 4 and their toroidal fields can project vertically as well as also horizontally into container 26.

We claim:

1. Particle source, in particular for a reactive ion beam etching or plasma deposition installation, with
  (a) a container (26) of a non-ferromagnetic and non-conducting material for a gas or gas mixture or plasma which has an upper face (27) and a side wall (28) and which has opposite the upper face (27) an aperture from which particles can emerge from the container;
  (b) a feed (55) for a gas or a gas mixture into the container;
  (c) an arrangement (29) for the feeding of electromagnetic waves, preferably microwaves, which adjoins the upper face (27) of the container;
  (d) at least one magnetic field generator which is configured outside of the container and which contains at least one north pole and one south pole, with the north and south pole being directed toward the container in such a manner that a curved magnetic field between north and south pole forms which projects into the interior of the container,
characterized in that
  (e) the arrangement for the feeding of electromagnetic waves is a flared radiator (29) whose widest flare opening corresponds essentially to the area of the upper face (27) of the container;
  (f) the side wall (28) of the container (26) is surrounded by an electrically conducting but not ferromagnetic hollow body (90);
  (g) the magnetic field generator (32, 33) is configured on the outside of the hollow body (90) and extends essentially from the aperture of the container (26) to the widest flare opening of the flared radiator (29).

2. Particle source as stated in claim 1, characterized in that the magnetic field generator (32, 33) completely surrounds the hollow body (90).

3. Particle source as stated in claim 1, characterized in that the poles of the magnetic field generator (32, 33) facing away from the hollow body (90) are connected with each other through a ferromagnetic yoke (34).

4. Particle source as stated in claim 1, characterized in that the flared radiator (29) is a conical horn radiator.

5. Particle source as stated in claim 1, characterized in that the flared radiator is a pyramidal horn radiator.

6. Particle source as stated in claim 1, characterized in that for potential isolation between the flared radiator (29) and the hollow body (90) an insulation layer is provided.

7. Particle source as stated in claim 1, characterized in that the strength of the magnetic field of the magnetic field generator is such that an electron cyclotron resonance develops.

8. Particle source as stated in claim 1, characterized in that the magnetic field generator contains at least two permanent magnets (32, 33) which are configured one above the other and enclose the circumference of the container (26), with the pole of the one permanent magnet (32) directed toward the container (26) being a north pole, while the pole of the other permanent magnet (33) directed toward the container (26) being a south pole and with the magnetic field lines of the two permanent magnets (32, 33) effecting an electron acceleration.

9. Particle source as stated in claim 1, characterized in that at the upper face (27) of the container (26) additional magnets are provided which generate toroidal magnetic fields (69) which project into the container (26).

10. Particle source as stated in claim 1, characterized in that the container (26) is additionally surrounded by an electromagnet (36) formed in the manner of a cylindrical coil (=solenoid).

11. Particle source as stated in claim 1, characterized in that at the aperture of the containe (26) at least one arrangement (4) is provided for controlled extraction of particles located in the container (26).

12. Particle source as stated in claim 1, characterized in that the flared radiator (29) is connected electrically conducting with the electrically conducting hollow body (90) of non-ferromagnetic material and that this hollow body (90) adjoins electrically insulated a coolable support (41).

13. Particle source as stated in claim 11, characterized in that the arrangement (4) for controlled extraction of particles located in the container (26) has three control grids (38, 39, 40) which are arranged on coolable supports (41, 42, 43), with these supports (41, 42, 43) being formed as hollow bodies through which flows a cooling agent.

14. Particle source as stated in claim 13, characterized in that at least one support (41) has a gas inlet (55) through which gas flows into the container (26).

15. Particle source as stated in claim 1, characterized in that the magnetic field generator is a horseshoe magnet whose north and south poles are directed toward the interior of the container (26).

16. Particle source as stated in claim 1, characterized in that at the aperture of the container (26) three control grids (38, 39, 40) arranged sequentially one behind the other are provided, and that for the generation of effective acceleration voltage for extracting positive ions the grid (38) closes to the plasma is at a positive potential, the central grid (39) at a negative potential, and the grid (40) furthest removed from the plasma is at zero potential.

17. Particle source as stated in claim 1, characterized in that at the aperture of the container (26) three control grids (38, 39, 40) arranged one behind the other are provided, and that for the generation of the effective acceleration voltage for extracting electrons and negative ions the grid (38) closest to the plasma is at a negative potential, the central grid (39) at a positive potential, and the grid (40) furthest removed from the plasma at zero potential.

18. Particle source as stated in claim 1, characterized in that at the aperture of the container (26) three control grids (38, 39, 40) arranged one behind the other are provided, and that for the generation of effective acceleration voltage for the extraction of neutral particles the grid (38) closest to the plasma is at a positive potential, the central grid (39) at a negative potential, and the grid (40) furthest removed from the plasma is at a positive potential.

19. Particle source as stated in claim 1, characterized in that at the aperture of the container (26) at least one magnetic extraction unit (60) is provided.

20. Particle source as stated in claim 1, characterized in that a pressure range in the container (26) is between $10^{-3}$ mbar and approximately 10 mbars.

* * * * *